(12) United States Patent
Liu et al.

(10) Patent No.: US 10,090,256 B2
(45) Date of Patent: Oct. 2, 2018

(54) SEMICONDUCTOR STRUCTURE

(71) Applicant: IBIS Innotech Inc., Taichung (TW)

(72) Inventors: Wen-Chun Liu, Taichung (TW); Wei-Jen Lai, Taichung (TW)

(73) Assignee: IBIS Innotech Inc., Taichung (TW)

( * ) Notice: Subject to any disclaimer, the term of this patent is extended or adjusted under 35 U.S.C. 154(b) by 39 days.

(21) Appl. No.: 15/364,185

(22) Filed: Nov. 29, 2016

(65) Prior Publication Data

US 2017/0077045 A1 Mar. 16, 2017

Related U.S. Application Data

(63) Continuation-in-part of application No. 15/232,808, filed on Aug. 10, 2016, now Pat. No. 9,801,282, (Continued)

(30) Foreign Application Priority Data

Jun. 24, 2014 (TW) .............................. 103121829 A

(51) Int. Cl.
*H01L 23/00* (2006.01)
*H01L 23/498* (2006.01)
(Continued)

(52) U.S. Cl.
CPC ...... *H01L 23/562* (2013.01); *H01L 23/49816* (2013.01); *H01L 23/49822* (2013.01); (Continued)

(58) Field of Classification Search
USPC .......................................... 361/767; 257/659
See application file for complete search history.

(56) References Cited

U.S. PATENT DOCUMENTS 6,727,174 B1 * 4/2004 Kotecki ............ H01L 21/76877
257/775
2010/0127372 A1 5/2010 Holland
(Continued)

FOREIGN PATENT DOCUMENTS

KR 20090124398 12/2009

OTHER PUBLICATIONS

"Office Action of Taiwan Counterpart Application", dated Feb. 16, 2017, p. 1-p. 4.
(Continued)

*Primary Examiner* — Andargie M Aychillhum
(74) *Attorney, Agent, or Firm* — JCIPRNET

(57) ABSTRACT

A semiconductor structure includes an insulating layer, a plurality of stepped conductive vias and a patterned circuit layer. The insulating layer includes a top surface and a bottom surface opposite to the top surface. The stepped conductive vias are disposed at the insulating layer to electrically connect the top surface and the bottom surface. Each of the stepped conductive vias includes a head portion and a neck portion connected to the head portion. The head portion is disposed on the top surface, and an upper surface of the head portion is coplanar with the top surface. A minimum diameter of the head portion is greater than a maximum diameter of the neck portion. The patterned circuit layer is disposed on the top surface and electrically connected to the stepped conductive vias.

15 Claims, 2 Drawing Sheets

Related U.S. Application Data which is a continuation-in-part of application No. 14/663,447, filed on Mar. 19, 2015, now Pat. No. 9,451,694.

(51) Int. Cl.

| | | |
|---|---|---|
| *H01L 25/10* | (2006.01) | |
| *H05K 1/03* | (2006.01) | |
| *H05K 3/18* | (2006.01) | |
| *H05K 3/40* | (2006.01) | |
| *H05K 1/11* | (2006.01) | |
| *H05K 3/00* | (2006.01) | |
| *H05K 3/10* | (2006.01) | |
| *H05K 3/46* | (2006.01) | |

(52) U.S. Cl.
CPC .. *H01L 23/49827* (2013.01); *H01L 23/49838* (2013.01); *H01L 23/49894* (2013.01); *H01L 25/105* (2013.01); *H05K 1/0373* (2013.01); *H05K 3/188* (2013.01); *H05K 3/4007* (2013.01); *H01L 24/16* (2013.01); *H01L 2224/04105* (2013.01); *H01L 2224/12105* (2013.01); *H01L 2224/16227* (2013.01); *H01L 2224/48091* (2013.01); *H01L 2224/48227* (2013.01); *H01L 2225/1023* (2013.01); *H01L 2225/1041* (2013.01); *H01L 2225/1058* (2013.01); *H01L 2924/18162* (2013.01); *H01L 2924/3511* (2013.01); *H01L 2924/35121* (2013.01); *H05K 1/113* (2013.01); *H05K 1/115* (2013.01); *H05K 3/0014* (2013.01); *H05K 3/105* (2013.01); *H05K 3/4697* (2013.01); *H05K 2201/0236* (2013.01); *H05K 2201/0376* (2013.01); *H05K 2201/0919* (2013.01); *H05K 2201/09063* (2013.01); *H05K 2201/09118* (2013.01); *H05K 2201/09845* (2013.01); *H05K 2201/10151* (2013.01); *H05K 2201/10515* (2013.01); *H05K 2201/10674* (2013.01)

(56) References Cited

U.S. PATENT DOCUMENTS

| | | | |
|---|---|---|---|
| 2012/0139090 A1* | 6/2012 | Kim | H01L 25/16 |
| | | | 257/659 |
| 2014/0042638 A1* | 2/2014 | Liu | H01L 23/49822 |
| | | | 257/774 |

OTHER PUBLICATIONS

Korczynski, "Wafer-level packaging of ICs for mobile systems of the future," Semiconductor Manufacturing & Designs Community, May 2014, pp. 1-5.

\* cited by examiner

SEMICONDUCTOR STRUCTURE

CROSS-REFERENCE TO RELATED APPLICATION

This is a continuation-in-part application of and claims the priority benefit of U.S. patent application Ser. No. 15/232,808, filed on Aug. 10, 2016, now pending. The prior patent application Ser. No. 15/232,808 is continuation-in-part application of patent application Ser. No. 14/663,447, filed on Mar. 19, 2015, now issued as U.S. Pat. No. 9,451,694, which claims the priority benefit of Taiwan patent application serial no. 103121829, filed on Jun. 24, 2014. The entirety of each of the above-mentioned patent applications is hereby incorporated by reference herein and made a part of this specification.

BACKGROUND

Field of the Invention

The invention relates to a semiconductor structure. More particularly, to a semiconductor structure with stepped conductive vias.

Description of Related Art

Recently, along with the rapid development of electronic technologies and the semiconductor industry, electronic products that are more user-friendly and with better performance are continuously placed in the market, and these products are designed to be lightweight and more compact than before. Due to present wafers, semiconductor devices or circuit boards all aiming at being implemented toward high integration, a line width between internal integrated circuits becomes smaller and smaller and even achieves a nano-size degree. However, a size of a conductive via is also restricted while the line width becomes smaller, which brings a great challenge to the manufacturing process of conductive vias with greater depths.

Moreover, as a material (e.g., copper) of conductive wires and the conductive vias has unsatisfactory engagement with a dielectric material having a low dielectric constant, a phenomenon of delamination, damage or crack, for example, sometimes occurs between the conductive wires and the dielectric material. In addition, due to the presence of coefficient difference of thermal expansion (CTEs) between the dielectric material and the conductive material, the engagement of the dielectric material and the conductive material is easily damaged by thermal stress and results in a warpage or delamination phenomenon, which leads to the reduction in reliability and life span of the semiconductor structure.

SUMMARY

The invention is directed to a semiconductor structure, which improves reliability of the semiconductor structure and effectively reduces diameters of the conductive vias thereof.

The present invention provides a semiconductor structure includes a first insulating layer, a plurality of first stepped conductive vias and a first patterned circuit layer. The first insulating layer includes a first top surface and a first bottom surface opposite to the first top surface. The first stepped conductive vias are disposed at the first insulating layer to electrically connect the first top surface and the first bottom surface. Each of the first stepped conductive vias includes a head portion and a neck portion connected to the head portion. The head portion is disposed at the first top surface, and an upper surface of the head portion is coplanar with the first top surface. A minimum diameter of the head portion is greater than a maximum diameter of the neck portion. A first patterned circuit layer is disposed at the first top surface and electrically connected to the first stepped conductive vias.

In an embodiment of the invention, a bottom surface of the first patterned circuit layer is lower than the first top surface.

In an embodiment of the invention, the head portion is mechanically drilled to form a vertical side wall, and the neck portion is formed by a laser drilling process.

In an embodiment of the invention, each of the first stepped conductive vias further includes a sub neck portion connected to the neck portion, the neck portion is connected between the head portion and the sub neck portion, and a minimum diameter of the neck portion is greater than a maximum diameter of the sub neck portion.

In an embodiment of the invention, each of the first stepped conductive vias further includes a base portion disposed at the first bottom surface, the neck portion is connected between the head portion and the base portion, and a minimum diameter of the base portion is greater than the maximum diameter of the neck portion.

In an embodiment of the invention, the base portion is mechanically drilled to form a vertical side wall.

In an embodiment of the invention, a material of the first insulating layer includes a selective-electroplating insulating material which includes a non-conductive metal complex or a generally used insulating material.

In an embodiment of the invention, a material of the first insulating layer includes epoxy, polyester, acrylate, fluorocarbon polymer, polyphenylene oxide, polyimide, phenolic resin, polysulfone, silicon polymer, bismaleimide-triazine (BT) modified epoxy resin, cyanate polyester, polyethylene, polycarbonate resin, acrylonitrile-butadiene-styrene (ABS) copolymer, polyethylene terephthalate (PET), polybutylene terephthalate (PBT), liquid crystal polyester, (LCP), polyamide (PA), nylon 6, polyoxymethylene (POM), polyphenylene sulfide (PPS), polycarbonate (PC), polymethacrylate (PMMA), ABS resin, or cyclic-olefin copolymer (COC).

In an embodiment of the invention, a metal of the non-conductive metal complex includes zinc, copper, silver, gold, nickel, palladium, platinum, cobalt, rhodium, iridium, indium, iron, manganese, aluminum, chromium, wolfram, vanadium, tantalum, titanium, or any combination thereof.

In an embodiment of the invention, the semiconductor structure further includes a second insulating layer, a second patterned circuit layer and a plurality of second stepped conductive vias. The second insulating layer includes a second top surface and a second bottom surface opposite to the second top surface, and the second insulating layer is stacked on the first insulating layer through the second bottom surface. The second patterned circuit layer is disposed at the second top surface. The second stepped conductive vias are disposed at the second insulating layer to electrically connect the first patterned circuit layer and the second patterned circuit layer.

In an embodiment of the invention, a material of the first insulating layer includes silicon or glass.

In an embodiment of the invention, the semiconductor structure further includes a first chip including an active surface and a back surface opposite to the active surface. The first insulating layer covers the active surface of the first chip and exposes the back surface. The first stepped conductive vias are connected between the first top surface and the active surface to electrically connect the first patterned circuit layer and the first chip.

In an embodiment of the invention, the semiconductor structure further includes a plurality of solder balls disposed at the first top surface and electrically connected to the first patterned circuit layer.

In an embodiment of the invention, the semiconductor structure further includes a first chip and a first redistribution layer. The first chip includes a first active surface and a first back surface opposite to the first active surface. The first insulating layer covers the first back surface of the first chip, and the first bottom surface exposes the first active surface. The first redistribution layer is disposed at the first bottom surface and electrically connected to the first active surface. The first stepped conductive vias penetrate the first insulating layer to connect the first patterned circuit layer and the first redistribution layer.

In an embodiment of the invention, each of the first stepped conductive vias further includes a base portion disposed at the first bottom surface, the neck portion is connected between the head portion and the base portion, and a minimum diameter of the base portion is greater than the maximum diameter of the neck portion.

In an embodiment of the invention, the semiconductor structure further includes a plurality of solder balls disposed on the first redistribution layer to be electrically connected to the first chip.

In an embodiment of the invention, the semiconductor structure further includes a second chip, a second insulating layer, a second redistribution layer and a plurality of solder balls. The second chip includes a second active surface and a second back surface opposite to the second active surface. The second insulating layer includes a second top surface and a second bottom surface opposite to the second top surface. The second insulating layer covers the second back surface of the second chip, and the second bottom surface exposes the second active surface. The second redistribution layer is disposed at the second bottom surface and electrically connected to the second active surface. The solder balls are connected between the first insulating layer and the second redistribution layer to electrically connect the first patterned circuit layer and the second redistribution layer.

In light of the foregoing, in the semiconductor structure of the invention, the stepped conductive vias are formed by stepwise drilling through performing the laser process at least twice or performing the mechanical drilling process at least once plus the laser process at least once, so as to reduce the drilling depth of each laser drilling process. Thus, the maximum diameter of each stepped conductive via can be reduced without reducing the depth of each stepped conductive via, such that density of the circuit layout of the semiconductor structure can be increased. Additionally, as mechanical drilling has advantages of high efficiency and being consistent in diameters of drilled aperture, effects of cost saving and size control can be achieved by combined its advantages with the laser process. Moreover, the stepped conductive via formed by this process is in a stepped shape, and the stepped shape can enhance bonding strength between the stepped conductive vias and the insulating layer. Thereby, the delamination between the stepped conductive vias and the insulating layer can be prevented, so as to improve the reliability of the semiconductor structure.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
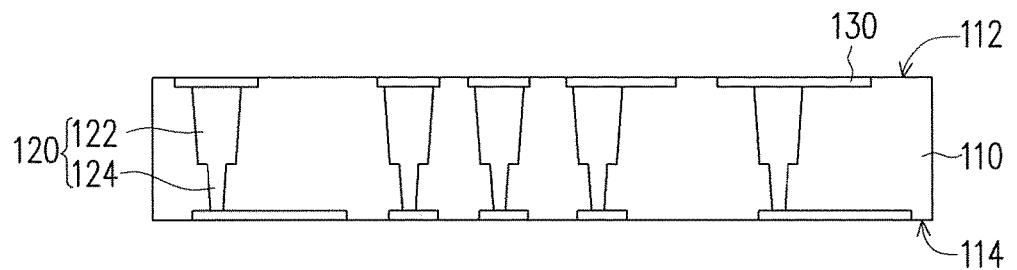
FIG. 1 is a schematic cross-sectional view of a semiconductor structure according to an embodiment of the invention.

FIG. 1 is a schematic cross-sectional view of a semiconductor structure according to an embodiment of the invention. Referring to FIG. 1, in the present embodiment, a semiconductor structure 100 includes a first insulating layer 110, a plurality of first stepped conductive vias 120 and a first patterned circuit layer 130. The first insulating layer 110 includes a first top surface 112 and a first bottom surface 114 opposite to the first top surface 112. The first stepped conductive vias 120 are disposed at the first insulating layer 110 to electrically connect the first top surface 112 and the first bottom surface 114. In the present embodiment, the first stepped conductive vias 120 may be formed by laser drilling or laser drilling in combination with mechanical drilling.

Generally, due to the limitation of the laser process, an aspect ratio of a conductive via formed by laser drilling cannot exceed 3:1. In other words, the depth of each conductive via can only reach, at most, triple of a maximum diameter of each conductive via, while the strength of mechanical drilling is restricted by the size, such that the mechanical drilling process has its limit in drilling depth. Thus, as a depth of a conductive via increases, a maximum diameter of the conductive via increases as well, such that the conductive via takes up more spaces, which is contradictory to the goal of high circuit integration that semiconductor devices are intent to achieve. Accordingly, in the present embodiment, the first stepped conductive vias 120 may be formed by performing the laser drilling process at least twice or performing the mechanical drilling process at least once plus the laser process at least once, so as to reduce the depth in each laser drilling. Thereby, the maximum diameter of the first stepped conductive vias 120 can be reduced without reducing the depth of each first stepped conductive via 120, such that density of the circuit layout of the semiconductor structure 100 can be enhanced.

Accordingly, each of the first stepped conductive vias 120 formed by the aforementioned manufacturing method includes a head portion 122 and a neck portion 124 connected to the head portion 122 as illustrated in FIG. 1. The head portion 122 is disposed at the first top surface 112 of the first insulating layer 110, and an upper surface of the head portion 122 is coplanar with the first top surface 112. A minimum diameter of the head portion 122 is greater than a maximum diameter of the neck portion 124. Namely, there is a step between the diameter of the head portion 122 and the diameter of the neck portion 124, such that each of the first stepped conductive via has a stepped shape. The stepped shape may also enhance the bonding strength between the first stepped conductive vias 120 and the first insulating layer 110 to prevent delamination between the first stepped conductive vias 120 and the first insulating layer 110.

Specifically, in the present embodiment, the method of forming the first stepped conductive vias 120 may include first drilling from the first top surface 112 to the bottom of the head portion 122 by mechanical or laser drilling, and then drilling from the bottom of the head portion 122 to the bottom of the neck portion 124 (i.e. the first bottom surface 114 in the present embodiment) by laser drilling. It should be noted that a side wall of a hole formed by mechanical drilling is substantially vertical. Namely, if the head portion 122 is formed by mechanical drilling, the diameters of the top and the bottom of the head portion 122 may be substantially the same. On the other hand, a hole formed by laser drilling is substantially in a funnel-like shape. In other words, if the head portion 122 and/or the neck portion 124 are formed by laser drilling, the diameter of the top of the head portion 122 and/or the neck portion 124 may be greater than the diameter of the bottom thereof.

In the present embodiment, the first patterned circuit layer 130 is disposed at the first top surface 112 of the first insulating layer 110 and electrically connected to the first stepped conductive vias 120. Certainly, the first patterned circuit layer 130 may be simultaneously disposed on the first top surface 112 and the first bottom surface 114 of the first insulating layer 110, and the first stepped conductive vias 120 may be used for electrically connecting the first patterned circuit layer 130 on the first top surface 112 and the first bottom surface 114. In the present embodiment, a material of the first insulating layer 110 includes a selective-electroplating insulating material or a generally used insulating material which includes non-conductive metal complex. In this way, the selective-electroplating characteristic of the first insulating layer 110 may be utilized in the present embodiment, such that the first patterned circuit layer 130 as illustrated in FIG. 1 is formed at the first top surface 112. In the present embodiment, the selective-electroplating insulating material may include epoxy, polyester, acrylate, fluorocarbon polymer, polyphenylene oxide, polyimide, phenolic resin, polysulfone, silicon polymer, bismaleimide-triazine (BT) modified epoxy resin, cyanate polyester, polyethylene, polycarbonate resin, acrylonitrile-butadiene-styrene (ABS) copolymer, polyethylene terephthalate (PET), polybutylene terephthalate (PBT), liquid crystal polyester, (LCP), polyamide (PA), nylon 6, polyoxymethylene (POM), polyphenylene sulfide (PPS), polycarbonate (PC), polymethacrylate (PMMA), ABS resin, cyclic-olefin copolymer (COC) or the like. A metal of the non-conductive metal complex may include zinc, copper, silver, gold, nickel, palladium, platinum, cobalt, rhodium, iridium, indium, iron, manganese, aluminum, chromium, wolfram, vanadium, tantalum, titanium, or any combination thereof.

In detail, the step of forming the first patterned circuit layer 130 by selectively electroplating the first top surface 112 of the first insulating layer 110 may include the following steps. A circuit trench corresponding to the first patterned circuit layer 130 is carved on the first top surface 112 of the first insulating layer 110 along a path where the first patterned circuit layer 130 is to be formed by laser, such that the non-conductive metal complex located on the circuit trench is damaged to release heavy metal nuclei which is highly active in metal reduction, or the inner surface of the circuit trench is roughened for absorbing seed crystal in a chemical plating solution. Then, the selective chemical plating and electroplating dielectric material processed by laser is selectively electroplated, so as to form the first patterned circuit layer 130 on the circuit trench by directly chemical plating and electroplating. Thus, the first patterned circuit layer 130 formed by the aforementioned process may be embedded in the first top surface 112 of the first insulating layer 110, and the first top surface 112 of the first insulating layer 110 exposes an upper surface of the first patterned circuit layer 130.

Moreover, in the present embodiment, the circuit trench corresponding to the first patterned circuit layer 130 is directly carved on the first top surface 112 of the first insulating layer 110 by laser, and then the first patterned circuit layer 130 is formed on the circuit trench by directly chemical plating and electroplating. Thus, a lower surface of the first patterned circuit layer 130 may be lower than the first top surface 112 of the first insulating layer 110. In addition, all lower surfaces of various patterned circuit layers which are directly formed on the surface of the first insulating layer 110 in this manner may be lower than the surface of the first insulating layer 110. Certainly, the present embodiment is only illustrated as an example and not intended to limit the present invention.

Additionally, the first stepped conductive vias 120 may also be formed as stepped-shaped vias by two separate laser processes, and then the stepped-shaped vias may be directly chemically plated or electroplated by utilizing the characteristic of the first insulating layer 110 capable of being selectively chemically plated and electroplated, such that a conductive material is formed in the stepped-shaped vias, thereby, the manufacturing process of the first stepped conductive vias 120 is substantially completed. Certainly, the present embodiment is merely an example for illustration. In another embodiment of the invention, a material of the first insulating layer 110 may also include silicon or glass. In other words, the first insulating layer 110 may be a silicon substrate or a glass substrate and employed as an inperposer, for example, and the first stepped conductive vias 120 may be deemed as vias in the silicon substrate or the glass substrate for electrical connection.

Figure 2:
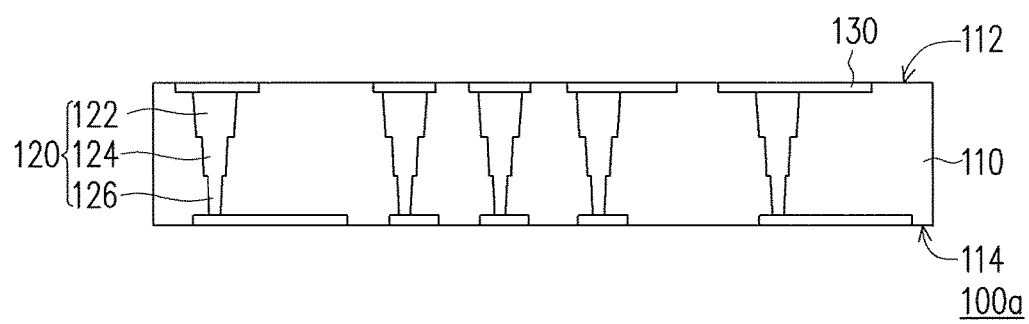
FIG. 2 is a schematic cross-sectional view of a semiconductor structure according to an embodiment of the invention.

FIG. 2 is a schematic cross-sectional view of a semiconductor structure according to an embodiment of the invention. It should be noted that a semiconductor structure 110a of the present embodiment is similar to the semiconductor structure 100 illustrated in FIG. 1. Thus, reference labels and part of the contents related to the previous embodiments are referenced in the present embodiment, where the same or similar elements are represented by the same reference labels, and the description with respect to the same technical content is omitted. The description related to the omitted part may refer to the previous embodiments, and will not be repeated in the present embodiment. Referring to FIG. 2, the difference between the semiconductor structure 110a of the present embodiment and the semiconductor structure 100 illustrated in FIG. 1 will be described hereinafter.

In the present embodiment, in the scenario that a required depth of the first stepped conductive vias 120 is deeper, each of the first stepped conductive vias 120 may further include a sub neck portion 126 connected to the neck portion 124. The neck portion 124 is connected between the head portion 122 and the sub neck portion 126, and a minimum diameter of the neck portion 124 is greater than a maximum diameter of the sub neck portion 126. In other words, in the scenario that a required depth of the first stepped conductive vias 120 is deeper, the first stepped conductive vias 120 may be stepwise formed as the stepped-shaped vias by performing the mechanical drilling process once plus the laser drilling process twice, performing the mechanical drilling process twice plus the laser drilling process once, or performing the laser process three times. Specifically, in the present embodiment, the method of forming the first stepped conductive vias 120 may include first drilling from the first top surface 122 to the bottom of the head portion 122 by mechanical or laser drilling, and then drilling from the bottom of the head portion 122 to the bottom of the neck portion 124 by laser. Then, another laser drilling is performed from the bottom of the neck portion 124 to the bottom of the sub neck portion 126 (which is the first bottom surface 114 in the present embodiment) by laser. Certainly, the present embodiment is merely an example for illustration. The invention is not intended to limit the number of times of using laser drilling for stepwise forming the first stepped conductive vias 120.

Figure 3:
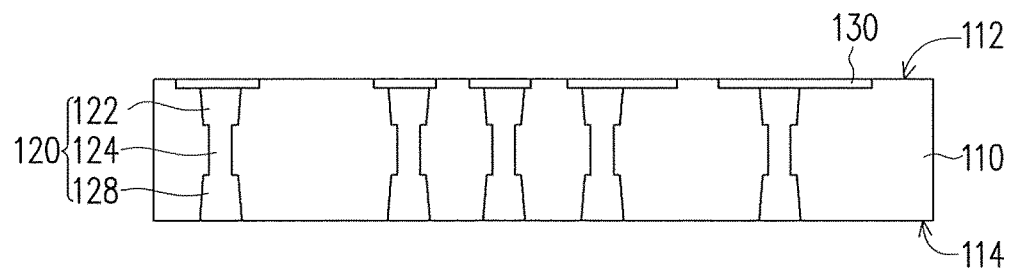
FIG. 3 is a schematic cross-sectional view of a semiconductor structure according to an embodiment of the invention.

FIG. 3 is a schematic cross-sectional view of a semiconductor structure according to an embodiment of the invention. It should be mentioned that a semiconductor structure 110b of the present embodiment is similar to the semiconductor structure 100 illustrated in FIG. 1. Thus, element labels and part of the contents related to the previous embodiments are referenced in the present embodiment, where the same or similar elements are represented by the same reference labels, and the description with respect to the same technical content is omitted. The description related to the omitted part may refer to the previous embodiments, and will not be repeated hereinafter. Referring to FIG. 3, the difference between the semiconductor structure 110b of the present embodiment and the semiconductor structure 100 illustrated in FIG. 1 will be described hereinafter.

In the present embodiment, in the scenario that a required depth of the first stepped conductive vias 120 is deeper, each of the first stepped conductive vias 120 may also include a base portion 128 disposed at the first top surface 114 of the first insulating layer 110, and the neck portion 124 is connected between the head portion 122 and the base portion 128. A minimum diameter of the base portion 128 is greater than the maximum diameter of the neck portion 124.

In other words, in the scenario that required depth of the first stepped conductive vias 120 is deeper, the head portion 122 and the base portion 128 may be formed by performing mechanical or laser drilling respectively from the first top surface 112 and the first bottom surface 114 toward the core of the first insulating layer 110. Then, a laser drilling process is performed from the bottom of the head portion 122 to the base portion 128. In this way, the diameter of the neck portion 124 gradually decreases from one end connecting the head portion 122 to another end away from the head portion 122. Alternatively, in another embodiment, the neck portion 124 may be formed by performing laser drilling from the bottom of the base portion 128 to the head portion 122. In this way, the diameter of the neck portion 124 gradually decreases from one end connecting the base portion 128 to another end away from the base portion 128. The present embodiment is merely an example for illustration. The invention is not intended to limit the number of times and the direction of drilling for stepwise forming the first stepped conductive vias 120 by mechanical drilling or laser.

Figure 4:
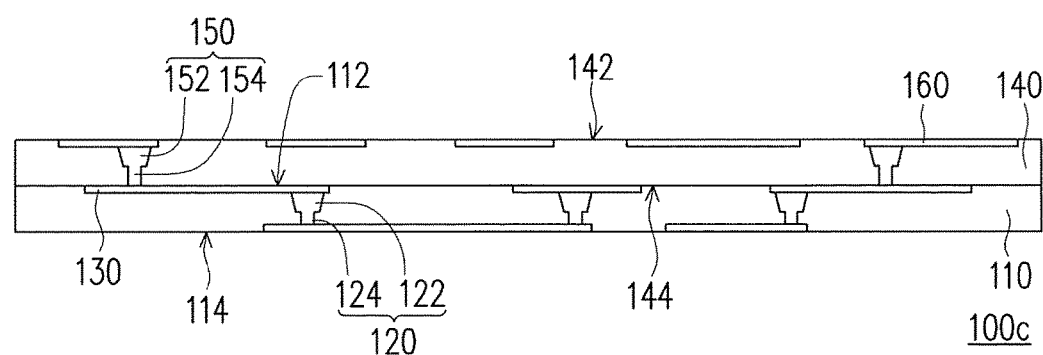
FIG. 4 is a schematic cross-sectional view of a semiconductor structure according to an embodiment of the invention.

FIG. 4 is a schematic cross-sectional view of a semiconductor structure according to an embodiment of the invention. It should be noted that a semiconductor structure 110c of the present embodiment is similar to the semiconductor structure 100 illustrated in FIG. 1. Thus, element labels and part of the contents related to the previous embodiments are referenced in the present embodiment, where the same or similar elements are represented by the same reference labels, and the description with respect to the same technical content is omitted. The description related to the omitted part may refer to the previous embodiments, and will not be repeated hereinafter. Referring to FIG. 4, the difference between the semiconductor structure 110c of the present embodiment and the semiconductor structure 100 illustrated in FIG. 1 will be described hereinafter.

In the present embodiment, the semiconductor structure 100c further includes a second insulating layer 140, a second patterned circuit layer 160 and a plurality of second stepped conductive vias 150. The second insulating layer 140 includes a second top surface 142 and a second bottom surface 144 opposite to the second top surface 142. The second insulating layer 140 is stacked on the first insulating layer 110 with the second bottom surface 144, and the second patterned circuit layer 160 is disposed on the second top surface 142. The second stepped conductive vias 150 are disposed at the second insulating layer 140 to electrically connect the first patterned circuit layer 130 and the second patterned circuit layer 160. In other words, the semiconductor structure 110c of the present embodiment is a multi-layered board structure.

Specifically, a material of the second insulating layer 140 may be similar to the material of the first insulating layer 110, which also includes a generally used insulating material or a selective-electroplating insulating material. The selective-electroplating insulating material includes a non-conductive metal complex. In this way, the selective-electroplating characteristic of the second insulating layer 140 may be utilized in the present embodiment, such that the second patterned circuit layer 160 as illustrated in FIG. 4 is formed on the first top surface 142. Thus, the second patterned circuit layer 160 formed by the aforementioned process is embedded in the second top surface 142 of the second insulating layer 140, and the second top surface 142 of the second insulating layer 140 exposes an upper surface of the second patterned circuit layer 160. Moreover, a lower surface of the second patterned circuit layer 160 is lower than the second top surface 142 of the second insulating layer 140.

Additionally, the second stepped conductive vias 150 may also be formed as stepped-shaped vias by two separate laser processes, and then the stepped-shaped vias may be directly chemically plated or electroplated by utilizing the characteristic of the second insulating layer 140 capable of being selectively chemically plated or electroplated, such that a conductive material is formed in the stepped-shaped vias. Thereby, the manufacturing process of the second stepped conductive vias 150 is substantially completed. Thus, a structure of the second stepped conductive vias 150 may be similar to that of the first stepped conductive vias 120 as illustrated in FIG. 1 to FIG. 3.

Figure 5:
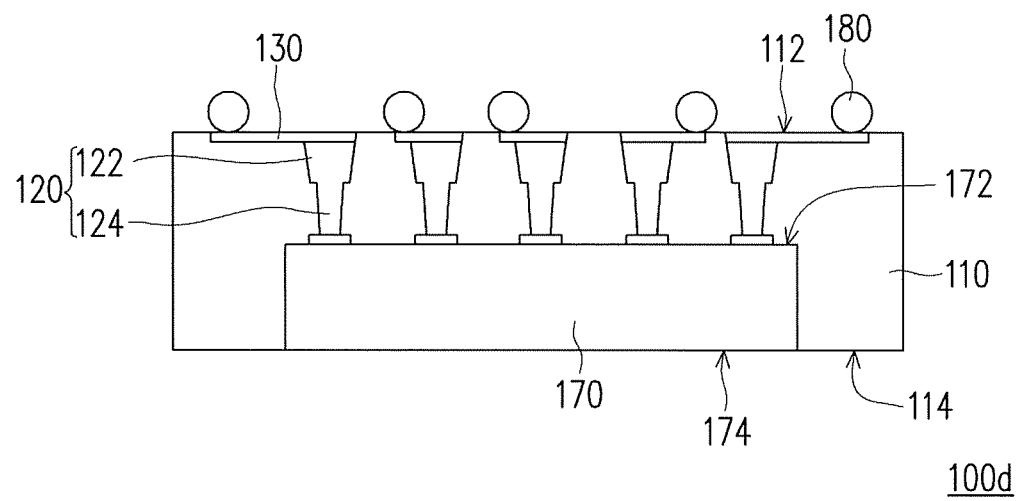
FIG. 5 is a schematic cross-sectional view of a semiconductor structure according to an embodiment of the invention.

FIG. 5 is a schematic cross-sectional view of a semiconductor structure according to an embodiment of the invention. It should be noted that a semiconductor structure 110d of the present embodiment is similar to the semiconductor structure 100 illustrated in FIG. 1. Thus, element labels and part of the contents related to the previous embodiments are referenced in the present embodiment, where the same or similar elements are represented by the same reference labels, and the description with respect to the same technical content is omitted. The description related to the omitted part may refer to the previous embodiments, and will not be repeated hereinafter. Referring to FIG. 5, the difference between the semiconductor structure 110d of the present embodiment and the semiconductor structure 100 illustrated in FIG. 1 will be described hereinafter.

In the present embodiment, the semiconductor structure 100d may further include a first chip 170 and a plurality of solder balls 180. The first chip 170 includes an active surface 172 and a back surface 174 opposite to the active surface 172. The first insulating layer 110 covers the active surface 172 of the first chip 170 and exposes the back surface 174. The first stepped conductive vias 120 are connected between the first top surface and the active surface 172 of the first chip 170, so as to electrically connect the first patterned circuit layer 130 located at the first top surface 112 and the first chip 170. The solder balls 180 are disposed at the first top surface 112 and electrically connected to the first patterned circuit layer 130. Thereby, the semiconductor structure 100d may be connected to an external electronic apparatus through the solder balls 180. Moreover, the first stepped conductive vias 120 not only is capable of electrically connecting the first patterned circuit layer 130 and the first chip 170, but also increases the bonding strength among the first chip 170, first stepped conductive vias 120 and the first insulating layer 110 with the stepped shape thereof, such that reliability of the semiconductor structure 100d can be increased.

Figure 6:
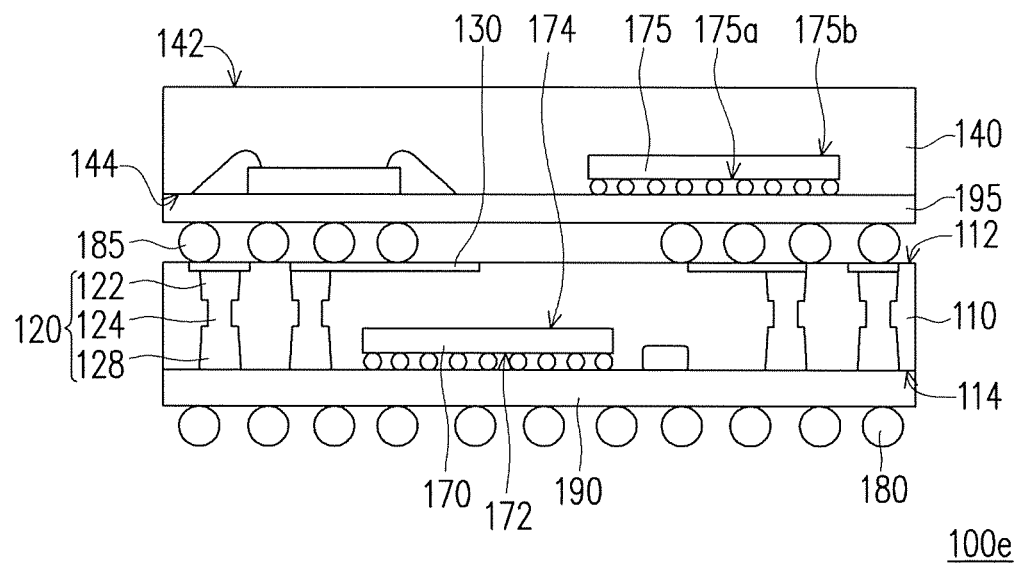
FIG. 6 is a schematic cross-sectional view of a semiconductor structure according to an embodiment of the invention.

FIG. 6 is a schematic cross-sectional view of a semiconductor structure according to an embodiment of the invention. It should be noted that a semiconductor structure 110e of the present embodiment is similar to the semiconductor structure 100 illustrated in FIG. 1. Thus, element labels and part of the contents related to the previous embodiments are referenced in the present embodiment, where the same or similar elements are represented by the same reference labels, and the description with respect to the same technical content is omitted. The description related to the omitted part may refer to the previous embodiments, and will not be repeated hereinafter. Referring to FIG. 6, the difference between the semiconductor structure 110e of the present embodiment and the semiconductor structure 100 illustrated in FIG. 1 will be described hereinafter.

In the present embodiment, the semiconductor structure 100e further includes a first chip 170 and a first redistribution layer 190. The first chip 170 includes an active surface 172 and a back surface 174 opposite to the active surface 172. The first insulating layer 110 covers the back surface 174 of the first chip 170, and the first bottom surface 114 of the first insulating layer 110 exposes the active surface 172. The first redistribution layer 190 is disposed at the first bottom surface 114 and electrically connected to the active surface 172 of the first chip 170. The first stepped conductive vias 120 may penetrate the first insulating layer 110 to connect the first patterned circuit layer 130 and the first redistribution layer 190.

In the present embodiment, the first stepped conductive vias 120 may further include a base portion 128 disposed at the first bottom surface 114 in a way similar to the embodiment illustrated in FIG. 3. The neck portion 124 is connected between the head portion 122 and the base portion 128, and a minimum diameter of the base portion 128 is greater than the maximum diameter of the connecting portion 124. In other words, in the scenario that the first stepped conductive vias 120 have to penetrate the first insulating layer 110 entirely, the head portion 122 and the base portion 128 may be formed by performing mechanical or laser drilling respectively from the first top surface 112 and the first bottom surface 114 toward the core of the first insulating layer 110. Then, the neck portion 124 connected between the head portion 122 and the base portion 128 may be formed by laser drilling. Certainly, the present embodiment is merely an example for illustration. The invention is not intended to limit the number of times and the drilling direction for stepwise forming the first stepped conductive vias 120 by laser or mechanical drilling.

In the present embodiment, the semiconductor structure 100e may further include a second chip 175, a second insulating layer 140, a second redistribution layer 195 and a plurality of solder balls 185. The second chip 175 includes an active surface 175a and a back surface 175b opposite to the active surface 175a. The second insulating layer 140 includes a second top surface 142 and a second bottom surface 144 opposite to the second top surface 142. The second insulating layer 140 covers the back surface 175b of the second chip 175, and the second bottom surface 144 exposes the active surface 175a of the second chip 175. The second redistribution layer 195 is disposed on the second bottom surface 144 and electrically connected to the active surface 175a of the second chip 175. The solder balls 185 are connected between the first insulating layer 110 and the second redistribution layer 195 to electrically connect the first patterned circuit layer 130 and the second redistribution layer 195. Additionally, the semiconductor structure 100e may further include a plurality of solder balls 180 disposed on the first redistribution layer 190 to be electrically connected to the first chip 170. In this way, the semiconductor structure 100e may be connected to another external electronic apparatus through the solder balls 180.

In sum, in the semiconductor structure of the invention, the stepped conductive vias are formed by stepwise drilling through performing the laser process at least twice or performing the mechanical drilling process at least once plus the laser process at least once, such that the depth in each laser drilling can be reduced. Thereby, the maximum diameter of the stepped conductive vias can be reduced without reducing the depth of each stepped conductive via, so as to increase the density of the circuit layout of the semiconductor structure. Additionally, as mechanical drilling has advantages of high efficiency and being consistent in diameters of drilled aperture, effects of cost saving and size control can be achieved by combined its advantages with the laser process. Moreover, the stepped conductive vias formed by this process have a stepped-shaped appearance, and the stepped-shaped appearance can enhance the bonding strength between the stepped conductive vias and the insulating layer. Thereby, the delamination between the stepped conductive vias and the insulating layer can be prevented, so as to improve the reliability of the semiconductor structure.

In addition, the insulating layer of the semiconductor structure of the invention includes generally used insulating material or selective-electroplating insulating material which includes the non-conductive metal complex. In this way, the selective-electroplating characteristic of the insulating layer of the semiconductor structure may be utilized to directly form the stepped conductive vias and the patterned circuit layer on the surface thereof, such that the manufacturing process of the semiconductor structure can be simplified, and the design flexibility can be improved.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A semiconductor structure, comprising:
    a first insulating layer, comprising a first top surface and a first bottom surface opposite to the first top surface;
    a plurality of first stepped conductive vias, disposed at the first insulating layer to electrically connect the first top surface and the first bottom surface, wherein each of the first stepped conductive vias comprises a head portion and a neck portion connected to the head portion, the head portion is disposed at the first top surface, an upper surface of the head portion is coplanar with the first top surface, and a minimum diameter of the head portion is greater than a maximum diameter of the neck portion, and each of the first stepped conductive vias is integrally formed; and
    a first patterned circuit layer, disposed at the first top surface and electrically connected to the first stepped conductive vias, wherein a bottom surface of the first patterned circuit layer is lower than the first top surface.

2. The semiconductor structure as claimed in claim 1, wherein each of the first stepped conductive vias further comprises a sub neck portion connected to the neck portion, the neck portion is connected between the head portion and the sub neck portion, and a minimum diameter of the neck portion is greater than a maximum diameter of the sub neck portion.

3. The semiconductor structure as claimed in claim 1, wherein each of the first stepped conductive vias further comprises a base portion disposed at the first bottom surface, the neck portion is connected between the head portion and the base portion, a minimum diameter of the base portion is greater than the maximum diameter of the neck portion.

4. The semiconductor structure as claimed in claim 1, wherein a material of the first insulating layer comprises epoxy, polyester, acrylate, fluorocarbon polymer, polyphenylene oxide, polyimide, phenolic resin, polysulfone, silicon polymer, bismaleimide-triazine (BT) modified epoxy resin, cyanate polyester, polyethylene, polycarbonate resin, acrylonitrile-butadiene-styrene (ABS) copolymer, polyethylene terephthalate (PET), polybutylene terephthalate (PBT), liquid crystal polyester, (LCP), polyamide (PA), nylon 6, polyoxymethylene (POM), polyphenylene sulfide (PPS), polycarbonate (PC), polymethacrylate (PMMA), ABS resin, or cyclic-olefin copolymer (COC).

5. The semiconductor structure as claimed in claim 1, wherein a material of the first insulating layer comprises a selective-electroplating insulating material which comprises a non-conductive metal complex.

6. The semiconductor structure as claimed in claim 5, wherein the selective-electroplating insulating material comprises epoxy, polyester, acrylate, fluorocarbon polymer, polyphenylene oxide, polyimide, phenolic resin, polysulfone, silicon polymer, BT modified epoxy resin, cyanate polyester, polyethylene, polycarbonate resin, ABS copolymer, PET, PBT, LCP, PA, nylon 6, POM, PPS, PC, PMMA, ABS resin, or COC.

7. The semiconductor structure as claimed in claim 5, wherein a metal of the non-conductive metal complex comprises zinc, copper, silver, gold, nickel, palladium, platinum, cobalt, rhodium, iridium, indium, iron, manganese, aluminum, chromium, wolfram, vanadium, tantalum, titanium, or any combination thereof.

8. The semiconductor structure as claimed in claim 1, further comprising:
    a second insulating layer, comprising a second top surface and a second bottom surface opposite to the second top surface, wherein the second insulating layer is stacked on the first insulating layer with the second bottom surface;
    a second patterned circuit layer, disposed at the second top surface; and
    a plurality of second stepped conductive vias, disposed at the second insulating layer to electrically connect the first patterned circuit layer and the second patterned circuit layer.

9. The semiconductor structure as claimed in claim 1, wherein a material of the first insulating layer comprises silicon or glass.

10. The semiconductor structure as claimed in claim 1, further comprising a first chip comprising an active surface and a back surface opposite to the active surface, the first insulating layer covering the active surface of the first chip and exposing the back surface, and the first stepped conductive vias being connected between the first top surface and the active surface to electrically connect the first patterned circuit layer and the first chip.

11. The semiconductor structure as claimed in claim 1, further comprising a plurality of solder balls disposed at the first top surface and electrically connected to the first patterned circuit layer.

12. The semiconductor structure as claimed in claim 1, further comprising:
    a first chip, comprising a first active surface and a first back surface opposite to the first active surface, the first insulating layer covering the first back surface of the first chip, and the first bottom surface exposing the first active surface; and
    a first redistribution layer, disposed at the first bottom surface and electrically connected to the first active surface, the first stepped conductive vias penetrating the first insulating layer to connect the first patterned circuit layer and the first redistribution layer.

13. The semiconductor structure as claimed in claim 12, wherein each of the first stepped conductive vias further comprises a base portion disposed at the first bottom surface, the neck portion is connected between the head portion and the base portion, and a minimum diameter of the base portion is greater than the maximum diameter of the neck portion.

14. The semiconductor structure as claimed in claim 12, further comprising a plurality of solder balls disposed on the first redistribution layer to be electrically connected to the first chip.

15. The semiconductor structure as claimed in claim 12, further comprising:
    a second chip, comprising a second active surface and a second back surface opposite to the second active surface;
    a second insulating layer, comprising a second top surface and a second bottom surface opposite to the second top surface, the second insulating layer covering the second back surface of the second chip, and the second bottom surface exposing the second active surface;
    a second redistribution layer, disposed at the second bottom surface and electrically connected to the second active surface; and
    a plurality of solder balls, connected between the first insulating layer and the second redistribution layer to electrically connect the first patterned circuit layer and the second redistribution layer.

* * * * *